United States Patent
Tomioka

(10) Patent No.: US 9,806,149 B2
(45) Date of Patent: Oct. 31, 2017

(54) SEMICONDUCTOR DEVICE AND METHOD OF MANUFACTURING THE SEMICONDUCTOR DEVICE

(71) Applicant: RENESAS ELECTRONICS CORPORATION, Kanagawa (JP)

(72) Inventor: Masahiro Tomioka, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/748,909

(22) Filed: Jun. 24, 2015

(65) Prior Publication Data

US 2015/0380490 A1    Dec. 31, 2015

(30) Foreign Application Priority Data

Jun. 25, 2014  (JP) ................................. 2014-130823

(51) Int. Cl.
 *H01L 29/10* (2006.01)
 *H01L 29/06* (2006.01)
 *H01L 29/66* (2006.01)
 *H01L 29/78* (2006.01)

(52) U.S. Cl.
 CPC ........ *H01L 29/0653* (2013.01); *H01L 29/105* (2013.01); *H01L 29/1083* (2013.01); *H01L 29/7836* (2013.01)

(58) Field of Classification Search
 CPC ................................................. H01L 29/1033
 See application file for complete search history.

(56) References Cited

U.S. PATENT DOCUMENTS

| 5,641,982 | A |   | 6/1997 | Takahashi |
| 6,071,775 | A | * | 6/2000 | Choi ............... H01L 21/823462 257/E21.625 |
| 2006/0231916 | A1 | * | 10/2006 | Fukumoto ........... H01L 29/7833 257/500 |
| 2006/0246652 | A1 | * | 11/2006 | Grivna ................ H01L 21/8249 438/234 |
| 2009/0039408 | A1 | * | 2/2009 | Hatano ............. H01L 21/76224 257/316 |
| 2013/0021840 | A1 | * | 1/2013 | Tokita ............. H01L 21/823842 365/156 |

FOREIGN PATENT DOCUMENTS

JP    8-130308 A    5/1996

\* cited by examiner

*Primary Examiner* — Su C Kim
*Assistant Examiner* — David S Wilbert
(74) *Attorney, Agent, or Firm* — McDermott Will & Emery LLP

(57) ABSTRACT

A MISFET has a threshold voltage that is not undesirably increased due to channel narrowing of the MISFET, and the MISFET is reduced in size and increased in withstand voltage. An anti-inversion p-type channel stopper region provided below an element isolation trench has an end that projects toward a channel region below a gate oxide film, and terminates short of the channel region. That is, the end is offset from the end of the channel region (the end of the element isolation trench). This suppresses diffusion in a lateral direction (channel region direction) of an impurity in the p-type channel stopper region, and thus suppresses a decrease in carrier concentration at the end of the channel region. As a result, a local increase in threshold voltage is suppressed.

2 Claims, 16 Drawing Sheets

SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2014-130823 filed on Jun. 25, 2014 including the specification, drawings and abstract is incorporated herein by reference in its entirety.

BACKGROUND

The present invention relates to a semiconductor device and a method of manufacturing the semiconductor device. For example, the invention can be preferably used for a semiconductor device including a metal-insulation-semiconductor field-effect transistor (MISFET) that operates at a high voltage of several tens of volts.

The semiconductor device is configured such that a number of circuit elements such as a metal-oxide semiconductor field-effect transistor (MOSFET), a resistance, and a capacitor are provided on a main surface of a semiconductor substrate composed of single-crystal silicon or the like, and the circuit elements are coupled to one another so as to perform required circuit operations and/or functions.

Japanese Unexamined Patent Application Publication No. Hei 08(1996)-130308 discloses a technique for improving a semiconductor device including a plurality of MOSFETs isolated from one another by channel stopper regions, the technique allowing the withstand voltage of each MOSFET to be increased and suppressing current leakage between a source region and a drain region of the MOSFET.

In the MOSFET described in JP-A-1996-130308, at least one of the source and drain regions is configured of a low-concentration region and a high-concentration region, each region having a conduction type opposite to that of a semiconductor substrate, and a channel stopper region having the same conduction type as that of the semiconductor substrate is provided below an element-isolating field oxide film. An offset region is provided to separate between the channel stopper region and each of the source region and the drain region. An end of the channel stopper region projects from a position below the field oxide film toward a region (a channel region) directly below a gate electrode so as to be in contact with the low-concentration region.

According to the MOSFET described in Japanese Unexamined Patent Application Publication No. Hei 08(1996)-130308, the offset region is provided between the channel stopper region and each of the source and drain regions, thereby even if the channel stopper region is increased in impurity concentration, reverse characteristics of a pn junction are not degraded, so that occurrence of a leakage current is suppressed. In addition, since the channel stopper region is in contact with the low-concentration region directly below the gate electrode, no inversion phenomenon occurs in a semiconductor layer (well region) adjacent to the channel region, and current leakage is prevented.

SUMMARY

With the semiconductor device, reduction in element size and provision of multiple power supplies (including a high-voltage power supply) have been promoted in response to market demands.

However, channel width is narrowed along with such reduction in element size, which causes a phenomenon of undesired increase in threshold voltage particularly in a high-voltage MOSFET to which a high voltage of several tens of volts is applied. This is because a MOSFET having a narrow channel width is apparently affected by an impurity that has diffused in a lateral direction (channel region direction) from the channel stopper region disposed in contact with the channel region.

FIG. 15A is a major-part plan layout diagram of a MOSFET in which a channel stopper region having the same conduction type as that of a semiconductor substrate is provided below an element-isolating field oxide film in order to increase withstand voltage. FIG. 15B is a major-part sectional diagram along a channel width direction indicated by a line A-A in FIG. 15A.

FIGS. 15A and 15B each exemplify an n-channel MOSFET, where FIG. 15A illustrates a planar layout of the MOSFET including a gate electrode 31 provided over a main surface of a p-type semiconductor substrate (or p-type well) 30, an n-type low-concentration region 32 and an n-type high-concentration region 33 that collectively configure each of a source region and a drain region. FIG. 15B illustrates a gate oxide film 34 provided below the gate electrode 31, a thick element-isolating field oxide film 35, and an anti-inversion p-type channel stopper region 36 provided below the field oxide film 35.

FIG. 16 is a graph illustrating a simulation result of an impurity profile in a region (the region enclosed by a broken line in FIG. 15B) near the end of the channel region of the MOSFET illustrated in FIGS. 15A and 15B. The simulation result shows that when the center of the channel region (a left end in FIG. 16) has an impurity (boron) concentration of $2 \times 10^{16}$ atoms/cm$^3$, the end of the channel region has an impurity concentration 50% higher than that of the center, i.e., $3 \times 10^{16}$ atoms/cm$^3$. This reveals that the impurity (boron) in the p-type channel stopper region 36 diffuses in a lateral direction (channel region direction).

It is further suggested that carrier (electron) concentration is lower at the end of the channel region than at the center of the channel region in conjunction with the impurity profile, leading to a local increase in threshold voltage.

Other issues and novel features will be clarified from the description of this specification and the accompanying drawings.

A typical measure to solve the problem disclosed in this application is briefly summarized as follows.

According to one embodiment of the present invention, there is provided a semiconductor device, in which a MISFET is provided in an active region partitioned by element isolation regions provided in a semiconductor substrate of a first conduction type, a channel stopper region of the first conduction type is provided in the semiconductor substrate below each element isolation region while an end of the channel stopper region projects toward the active region, and the end of the channel stopper region is offset from an end of the element isolation region in a direction away from the active region.

The effect of the typical measure to solve the problem disclosed in this application is briefly described as follows.

According to the one embodiment of the invention, reduction is size and an increase in withstand voltage of a MISFET are achieved in a semiconductor device including the MISFET.

DETAILED DESCRIPTION

Hereinafter, one embodiment of the invention is described in detail with reference to accompanying drawings. In all drawings for explaining the following embodiment, components having the same function are designated by the same numeral, and duplicated description is omitted. In this embodiment, the same or a similar portion is in principle not repeatedly described except for a particularly necessary case. Furthermore, a plan diagram for explaining this embodiment may also be hatched to easily understand a configuration.

Figure 1:
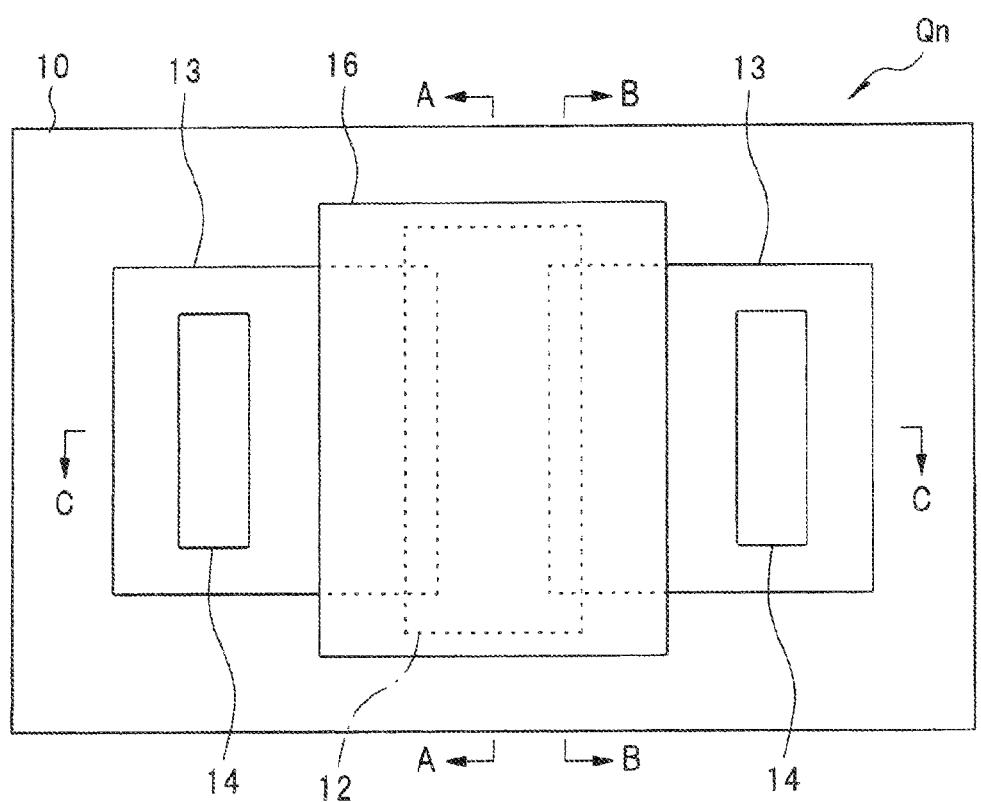
FIG. 1 is a major-part plan layout diagram of a MISFET according to one embodiment of the invention.
Figure 2A:
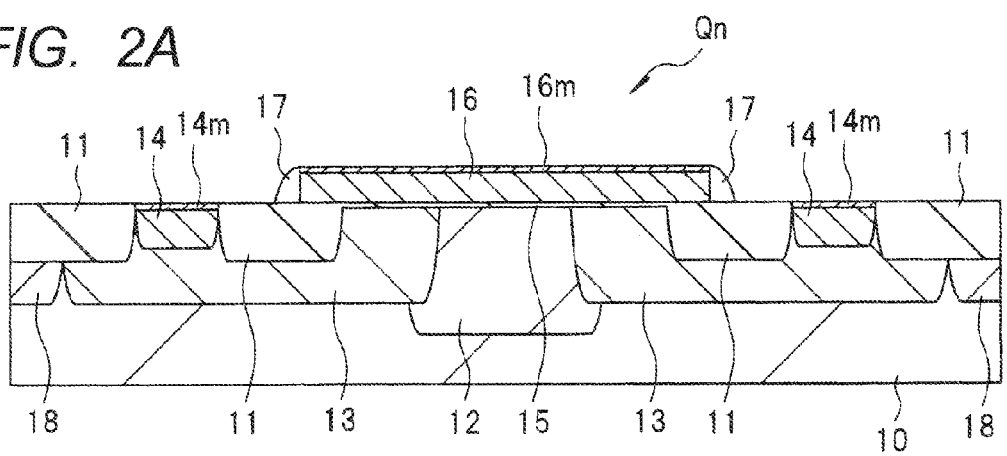
FIGS. 2A, 2B, and 2C are major-part sectional diagrams of the MISFET along lines C-C, A-A, and B-B, respectively, in FIG. 1.
Figure 2B:
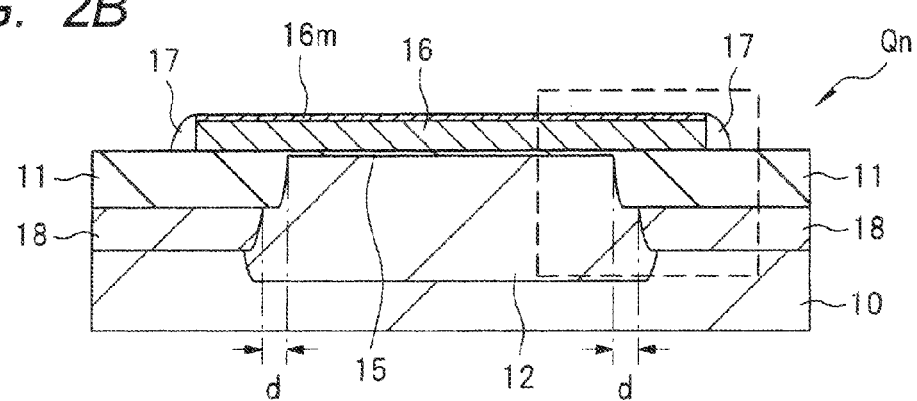
Figure 2C:
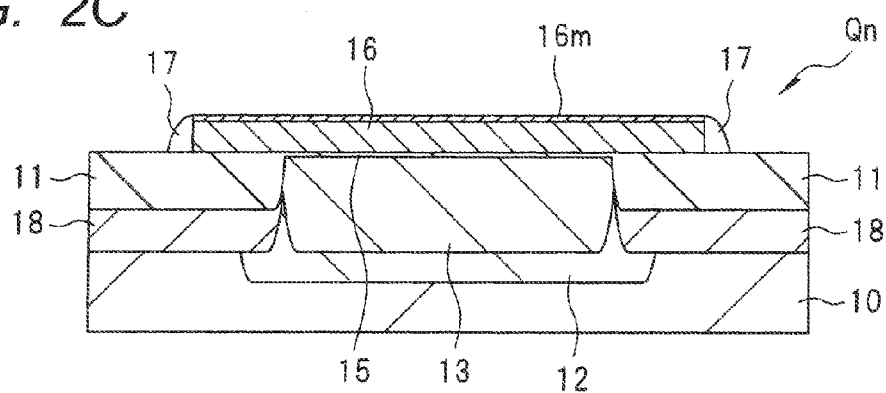

The semiconductor device according to this embodiment is now described with reference to drawings. FIG. 1 is a major-part plan layout diagram of the semiconductor device according to this embodiment. FIGS. 2A, 2B, and 2C are major-part sectional diagrams of the semiconductor device along lines C-C, A-A, and B-B, respectively, in FIG. 1. For better viewability, FIG. 1 illustrates only conductive layers (excluding a p-type channel stopper region) configuring the MISFET, and does not illustrate insulating layers.

For example, element isolation trenches 11 are provided in a main surface portion of a semiconductor substrate 10 composed of p-type single-crystal silicon having a specific resistance of about 1 to 10 $\Omega \cdot cm$, and an n-channel MISFET (Qn) is provided in an active region of the semiconductor substrate 10, the active region being isolated (partitioned) by the element isolation trenches 11. An anti-inversion p-type channel stopper region 18 is provided in the semiconductor substrate 10 below the element isolation trench 11 in order to increase the withstand voltage of the MISFET (Qn).

The n-channel MISFET (Qn) is what is called high-voltage MISFET that operates at a high voltage of, for example, about 30 to 40 V, and is used as an element as a part of a liquid crystal driver circuit, for example. The configuration of the MISFET (Qn) is now specifically described.

The MISFET (Qn) includes a p-type well 12 provided in the semiconductor substrate 10, a pair of n-type low-concentration regions 13 and 13 and a pair of n-type high-concentration regions 14 and 14 provided in the semiconductor substrate 10 across the p-type well 12, a gate oxide film 15 provided in a surface portion of the active region, and a gate electrode 16 provided extending over the element isolation trench 11 and the gate insulating film 15.

The pair of n-type low-concentration regions 13 and 13 and the pair of n-type high-concentration regions 14 and 14 provided in the semiconductor substrate 10 are semiconductor regions configuring each of the source region and the drain region of the MISFET (Qn). Specifically, each of the source region and the drain region of the MISFET (Qn) has a lightly doped drain (LDD) structure. Each n-type high-concentration region 14 is high in impurity (phosphorus or arsenic) concentration and shallow in junction depth compared with each n-type low-concentration region 13. A metal silicide layer 14m, which reduces a difference in electric resistance from an undepicted interconnection to be coupled to each n-type high-concentration region 14, is provided on the surface of the n-type high-concentration region 14. The metal silicide layer 14m is composed of, for example, nickel silicide.

The gate electrode 16 of the MISFET (Qn) is comprised of an n-type polycrystalline silicon film doped with, for example, phosphorus and a metal silicide layer 16m provided on the surface of the polycrystalline silicon film. The metal silicide layer 16m is composed of, for example, nickel silicide. A sidewall spacer 17 composed of a silicon oxide film or the like is provided on each sidewall of the gate electrode 16.

As illustrated in FIG. 2B, the p-type channel stopper region 18 provided below the element isolation trench 11 has an end that projects toward the channel region below the gate oxide film 15 in a region below the gate electrode 16, and terminates short of the channel region. Specifically, the end of the p-type channel stopper region 18 along the gate width direction is offset (separated) by a distance (d) from the end of the channel region (the end of the element isolation trench 11) in the region below the gate electrode 16.

As illustrated in FIG. 2C, the end of the p-type channel stopper region 18 is desirably in contact with an end of each n-type low-concentration region 13 in the region below the gate electrode 16. This prevents an inversion phenomenon in the p-type well 12 adjacent to the channel region directly below the gate electrode 16, so that current leakage can be prevented.

Figure 3:
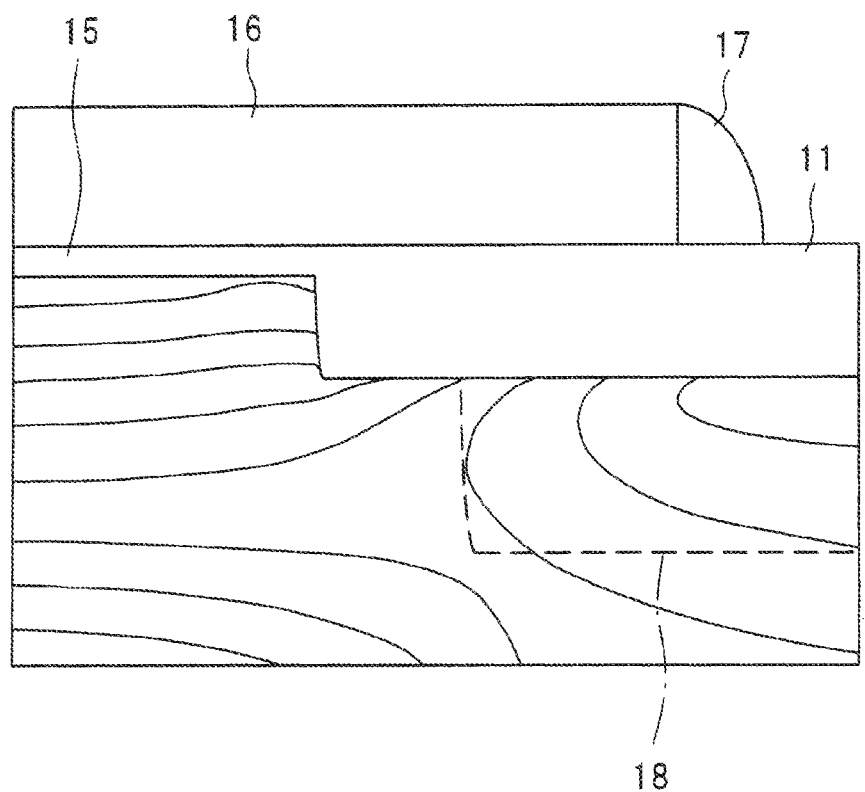
FIG. 3 is a graph illustrating a simulation result of an impurity profile in a region near an end of a channel region of the MISFET according to the one embodiment.

FIG. 3 is a graph illustrating a simulation result of an impurity profile in a region near the end of the channel region (the region enclosed by a broken line in FIG. 2B) of the MISFET (Qn) illustrated in FIGS. 1 to 2C. The simulation result reveals that the impurity profile in the end portion of the channel region is substantially similar to that in the central portion (the left end portion of FIG. 3) of the channel region.

In this way, the end of the p-type channel stopper region 18 along the gate width direction is separated from the end of the channel region (the end of the element isolation trench 11). This prevents diffusion of an impurity (boron) in the p-type channel stopper region 18 in a lateral direction (channel region direction). Consequently, even if the MISFET (Qn) is reduced in size (narrowed in channel), it is possible to suppress a decrease in carrier (electron) concentration at the end of the channel region, and thus suppress a local increase in threshold voltage. It is therefore possible to achieve reduction in size and increase in withstand voltage of the MISFET (Qn).

In the MISFET (Qn) according to this embodiment, the separation distance (d) between the end of the p-type channel stopper region 18 and the end of the channel region (the end of the element isolation trench 11) is preferably about 0.5 to 0.7 μm, and most preferably about 0.6 μm. If the offset distance (d) is too short, the impurity (boron) in the p-type channel stopper region 18 apparently diffuses in the lateral direction (channel region direction). If the offset distance (d) is too long, the effect of the p-type channel stopper region 18 provided below the element isolation trench 11 is inhibited, and inversion easily occurs in the p-type well 12 below the element isolation trench 11 when high voltage is applied to the gate electrode 16.

A method of manufacturing the n-channel MISFET (Qn) is now described with reference to FIGS. 4A to 14C. For better viewability, each plan diagram for explaining the manufacturing method exclusively shows the conductive layers (excluding the p-type channel stopper region 18) configuring the MISFET (Qn), and does not show the insulating layers (such as the element isolation trench 11, the gate oxide film 15, and a photoresist film).

Figure 4A:
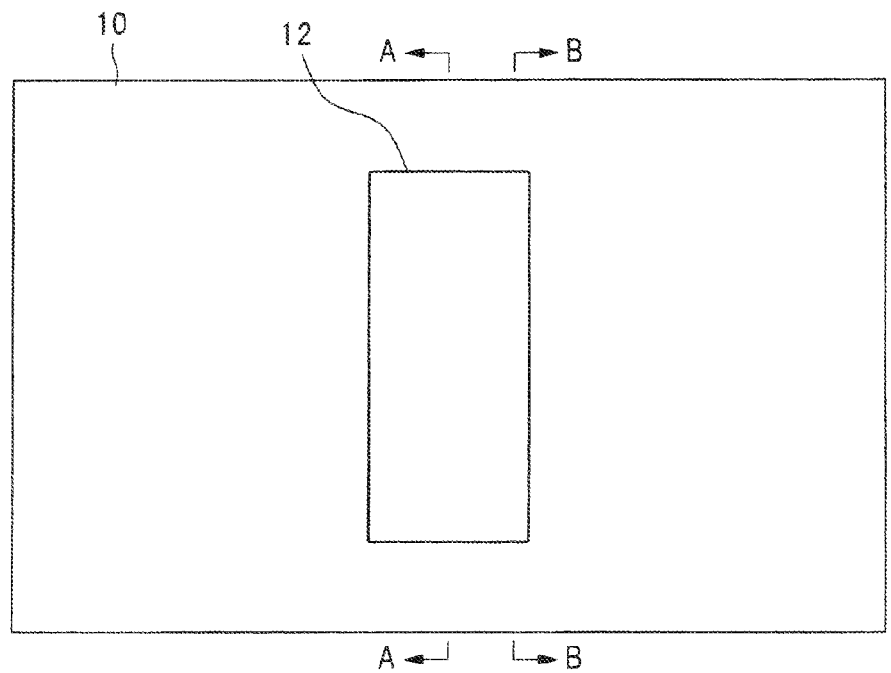
FIG. 4A is a major-part plan layout diagram of a semiconductor device according to one embodiment of the invention during a manufacturing process thereof.
Figure 4B:
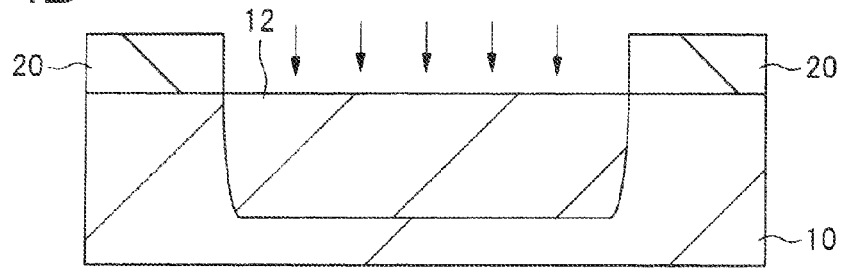
FIGS. 4B and 4C are major-part sectional diagrams of the semiconductor device along lines A-A and B-B, respectively, in FIG. 4A.
Figure 4C:
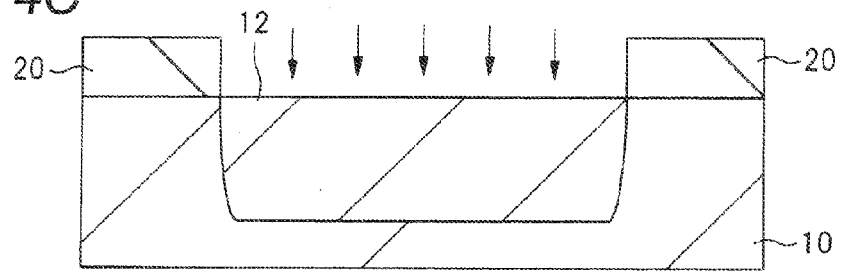
Figure 5A:
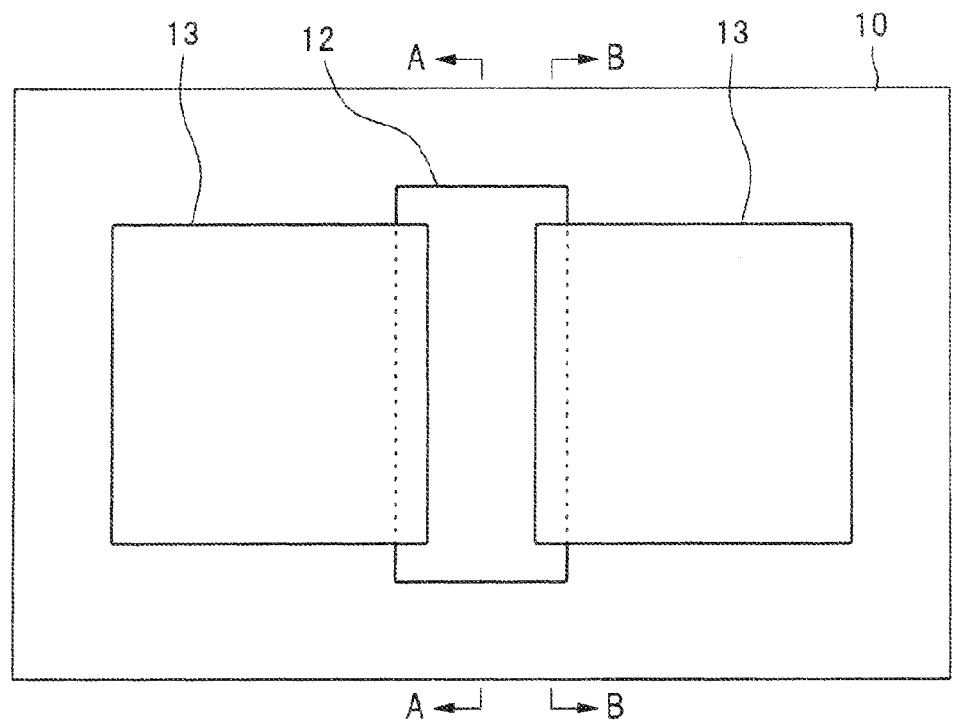
FIG. 5A is a major-part plan layout diagram of the semiconductor device during the manufacturing process following FIGS. 4A to 4C.
Figure 5B:
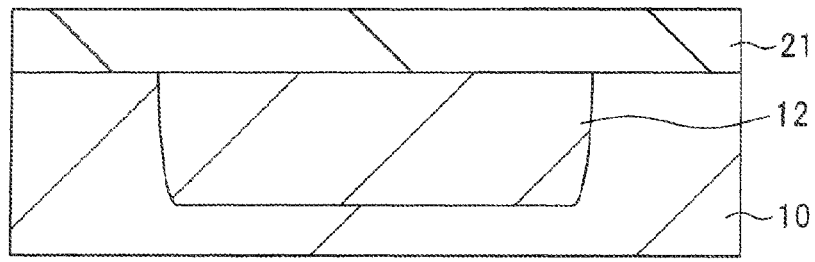
FIGS. 5B and 5C are major-part sectional diagrams of the semiconductor device along lines A-A and B-B, respectively, in FIG. 5A.
Figure 5C:
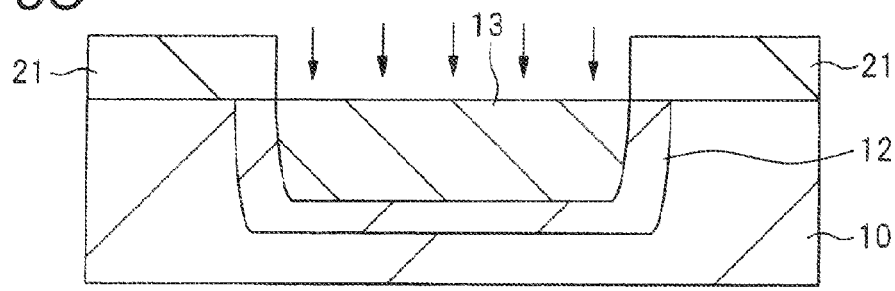

First, as illustrated in FIGS. 4A to 4C, an impurity (boron) is ion-implanted into the semiconductor substrate 10 with a photoresist film 20 as a mask, so that the p-type well 12 is formed. Subsequently, the photoresist film 20 is removed by ashing or wet etching, and then as illustrated in FIGS. 5A to 5C, an impurity (phosphorus or arsenic) is ion-implanted into the semiconductor substrate 10 with a photoresist film 21 as a mask, so that the n-type low-concentration region 13 is formed.

As illustrated in FIG. 4A, the p-type well 12 and the n-type low-concentration region 13 are formed such that their one end portions overlap with each other in a gate length direction (the right-and-left direction in FIG. 4A).

The p-type well 12 and the n-type low-concentration region 13 may be formed in an appropriate order. That is, the n-type low-concentration region 13 may be formed before formation of the p-type well 12.

Figure 6A:
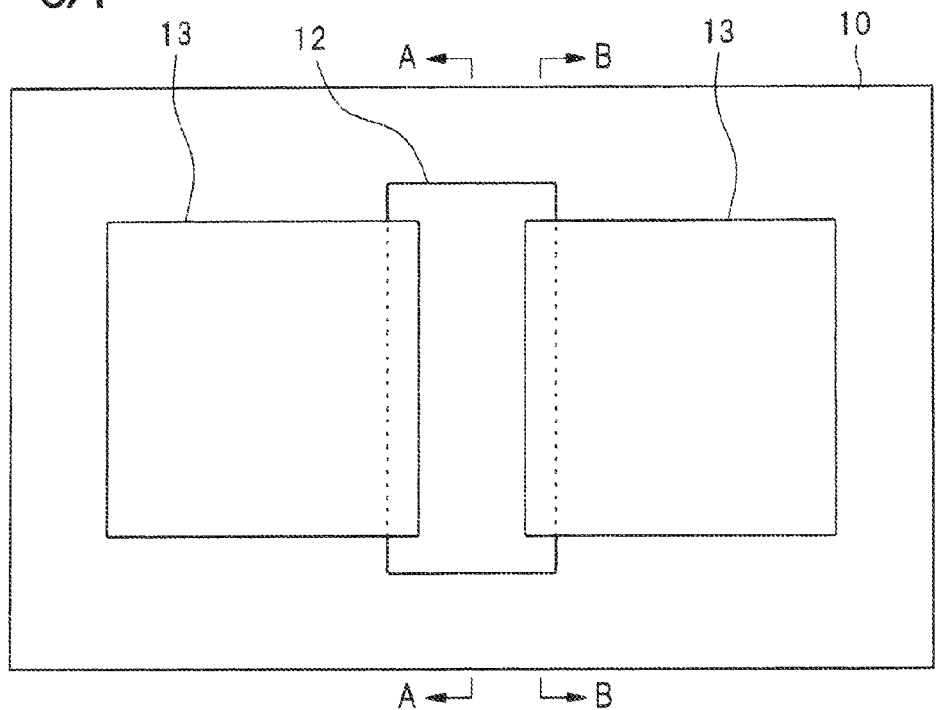
FIG. 6A is a major-part plan layout diagram of the semiconductor device during the manufacturing process following FIGS. 5A to 5C.
Figure 6B:
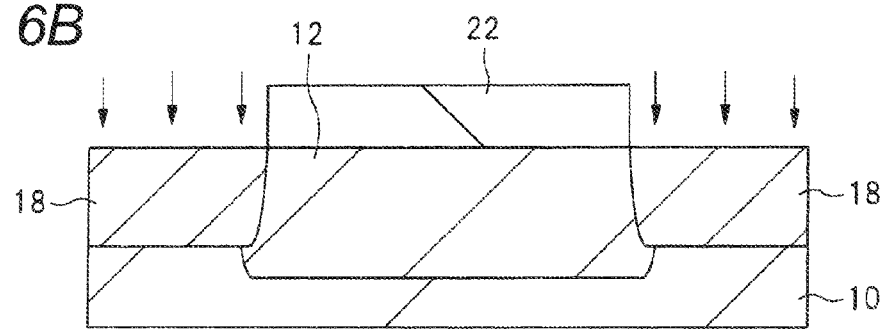
FIGS. 6B and 6C are major-part sectional diagrams of the semiconductor device along lines A-A and B-B, respectively, in FIG. 6A.
Figure 6C:
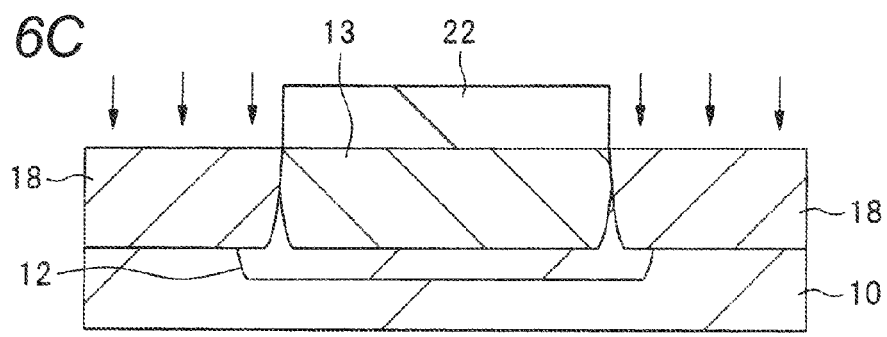

Subsequently, the photoresist film 21 is removed by ashing or wet etching, and then as illustrated in FIGS. 6A to 6C, the impurity (boron) is ion-implanted into the semiconductor substrate 10 with a photoresist film 22 as a mask, so that the p-type channel stopper region 18 is formed.

Figure 7A:
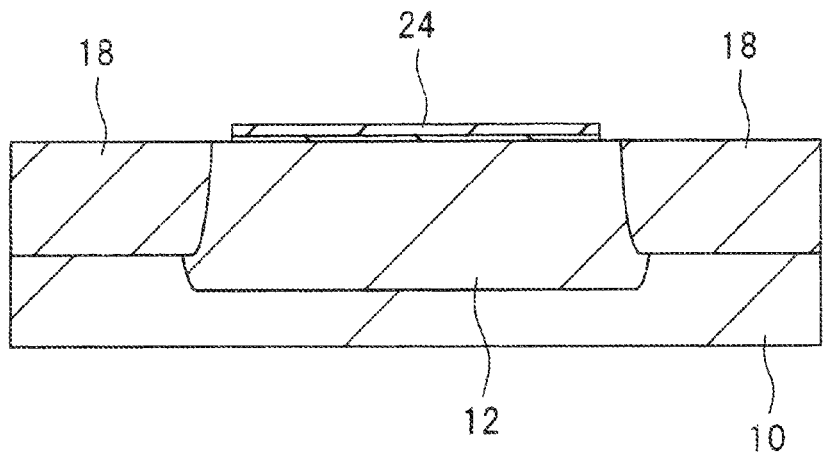
FIGS. 7A and 7B are each a major-part sectional diagram of the semiconductor device during the manufacturing process following FIGS. 6A to 6C.
Figure 7B:
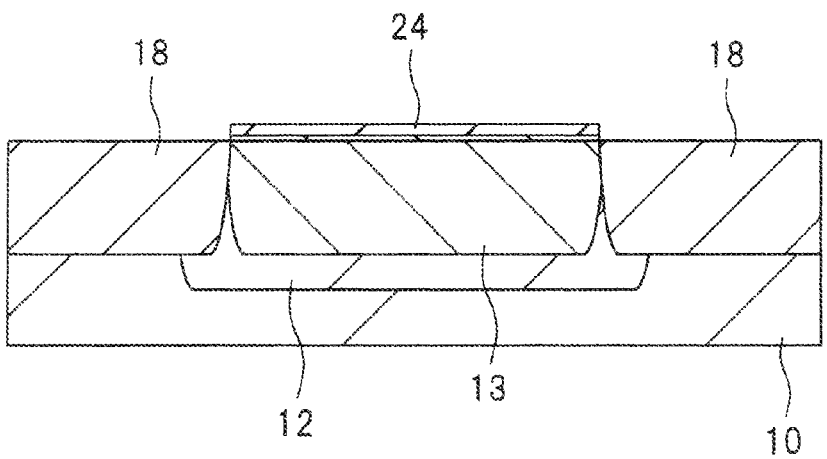

Subsequently, the photoresist film 22 is removed by ashing or wet etching, and then as illustrated in FIGS. 7A and 7B, a hard mask 24 is formed so as to cover the active region of the semiconductor substrate 10. For example, the hard mask 24 is formed as follows: A silicon oxide film is formed on the main surface of the semiconductor substrate 10 by a thermal oxidation process or a CVD process, and then a silicon nitride film is stacked on the silicon oxide film by a CVD process, and finally such stacked films are patterned by dry etching with a photoresist film as a mask.

Figure 8A:
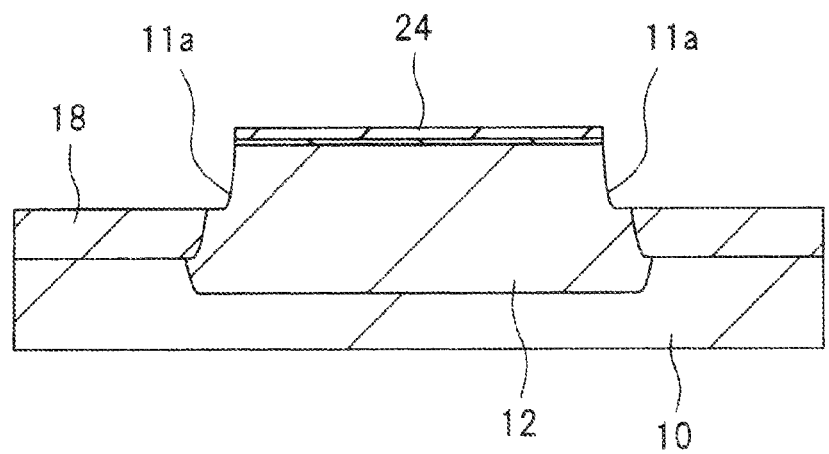
FIGS. 8A and 8B are each a major-part sectional diagram of the semiconductor device during the manufacturing process following FIGS. 7A and 7B.
Figure 8B:
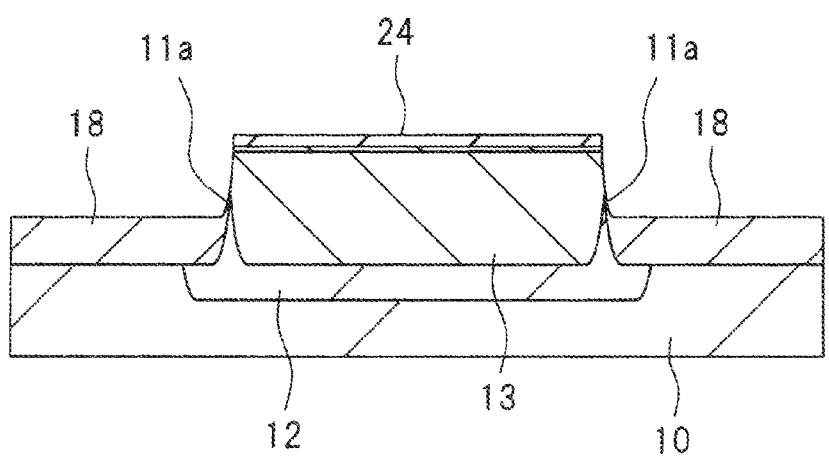
Figure 9A:
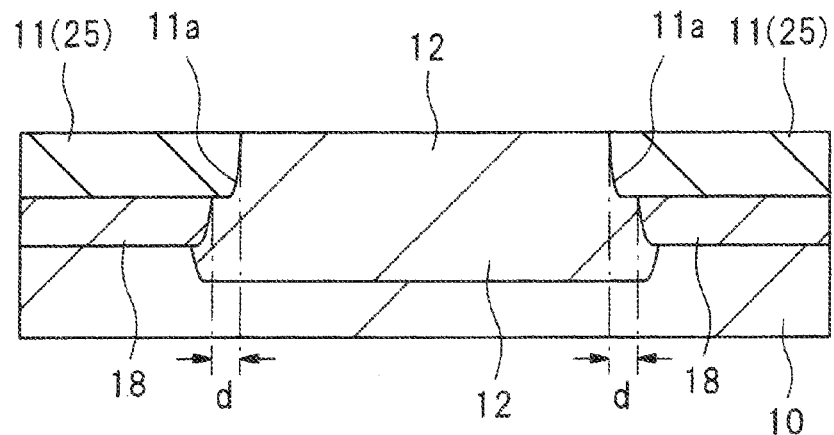
FIGS. 9A and 9B are each a major-part sectional diagram of the semiconductor device during the manufacturing process following FIGS. 8A and 8B.
Figure 9B:
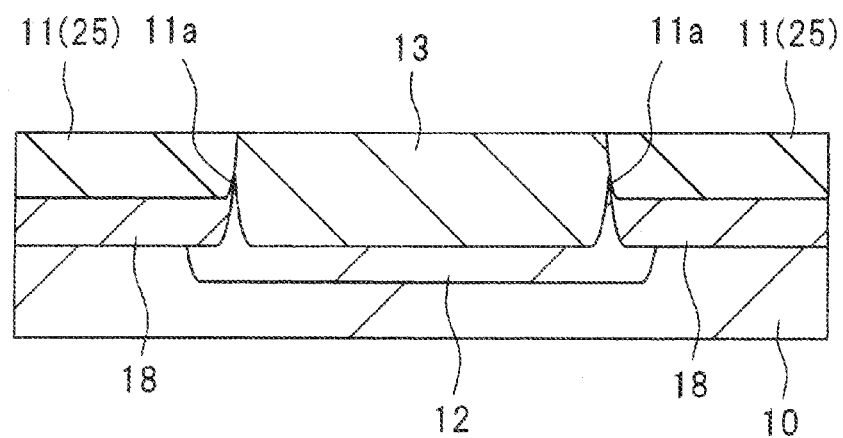

Subsequently, as illustrated in FIGS. 8A and 8B, the semiconductor substrate 10 is dry-etched with the hard mask 24 as a mask so that a trench 11a is formed in the semiconductor substrate 10 in each element isolation region. Subsequently, as illustrated in FIGS. 9A and 9B, a silicon oxide film 25 is deposited by a CVD process over the main surface of the semiconductor substrate 10, and then the silicon oxide film 25 is planarized by a chemical mechanical polishing (CMP) process so as to be left within the trench 11a, and then the silicon oxide film 25 covering the active region of the semiconductor substrate 10 is removed by wet etching. Consequently, the element isolation trench 11 filled with the hard mask 25 is formed in the semiconductor substrate 10 in the element isolation region, and the p-type channel stopper region 18 formed in the previous step is disposed below the element isolation trench 11.

The element isolation trench 11 is formed in such a manner that the p-type channel stopper region 18 is offset (separated) by a distance (d) from the end of the channel region (the end of the element isolation trench 11) below the gate oxide film 15 formed in a later step.

In the above process, the element isolation trench 11 is formed by filling the trench 11a, which is formed in the semiconductor substrate 10 in the element isolation region, with the silicon oxide film 25. In another possible process, a field oxide film is formed in the element isolation region by what is called LOCOS process, in which a silicon oxide film is formed in the surface portion of the semiconductor substrate 10 in the element isolation region and is then thickened by heat treatment, and the p-type channel stopper region 18 is disposed below the field oxide film.

Figure 10A:
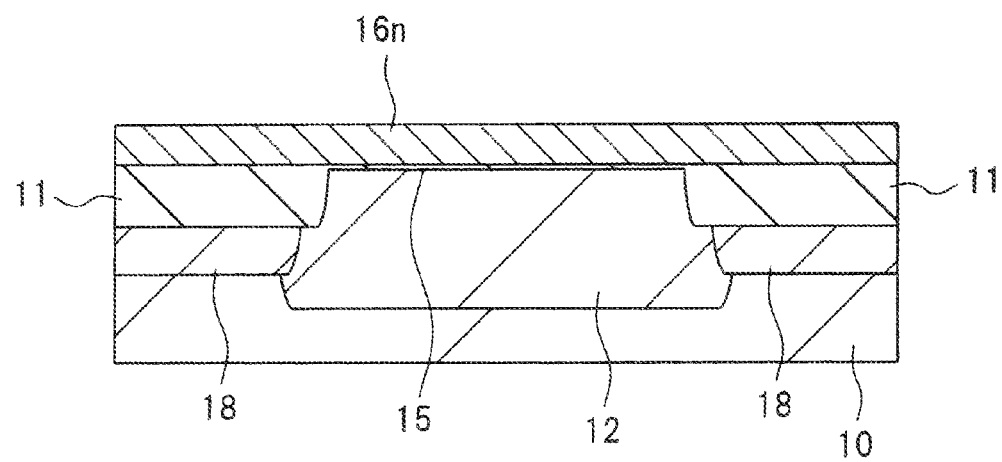
FIGS. 10A and 10B are each a major-part sectional diagram of the semiconductor device during the manufacturing process following FIGS. 9A and 9B.
Figure 10B:
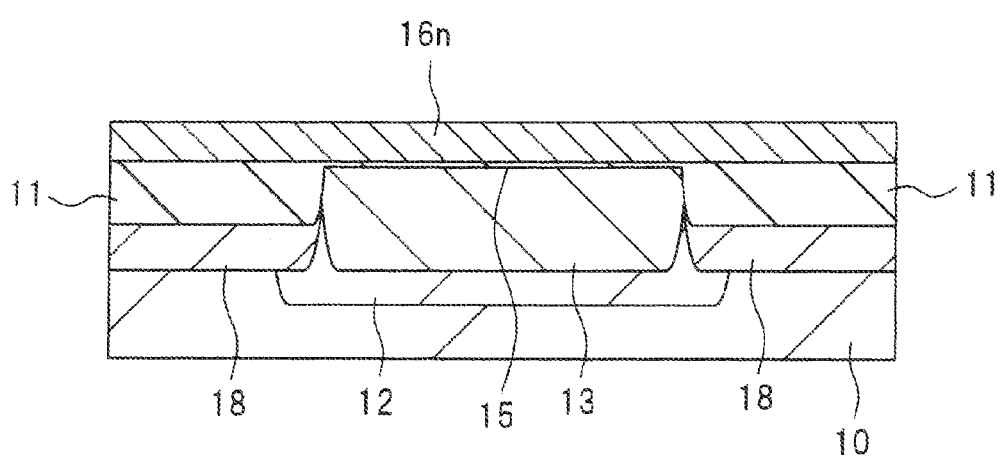

Subsequently, as illustrated in FIGS. 10A and 10B, the gate oxide film 15 composed of silicon oxide is formed in the surface portion of the active region through heat treatment of the semiconductor substrate 10, and then a polycrystalline silicon film 16n is deposited by a CVD process over the main surface of the semiconductor substrate 10. The polycrystalline silicon film 16n is doped with phosphorus during such deposition so as to show n-type conduction. The gate oxide film 15 may also be formed by patterning a silicon oxide film, which has been deposited by a CVD process, by dry etching so that part of the silicon oxide film is left in the surface portion of the active region.

Figure 11A:
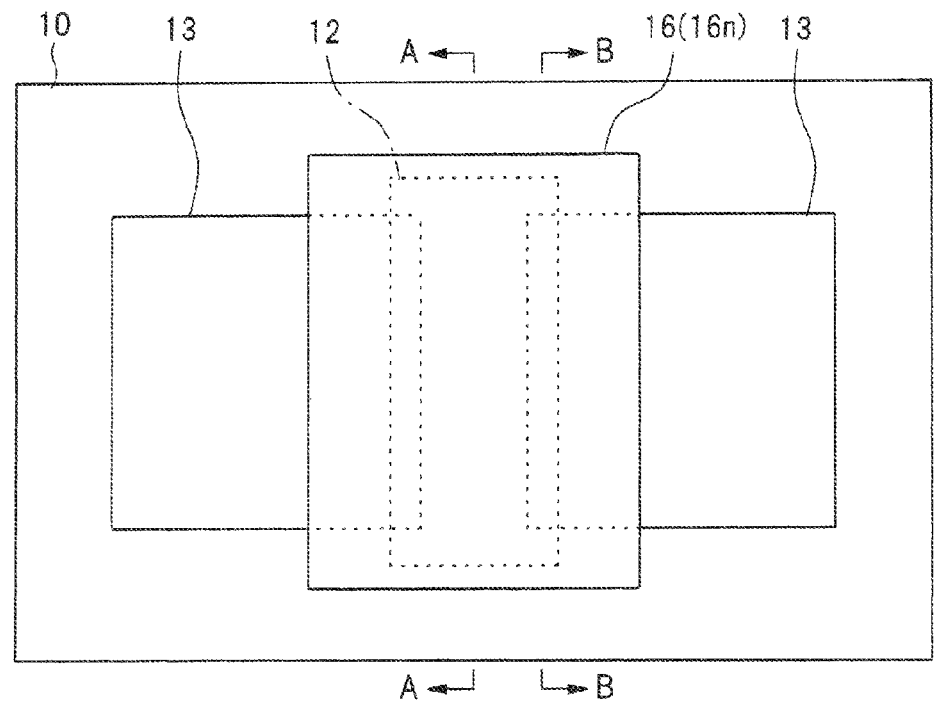
FIG. 11A is a major-part plan layout diagram of the semiconductor device during the manufacturing process following FIGS. 10A and 10B.
Figure 11B:
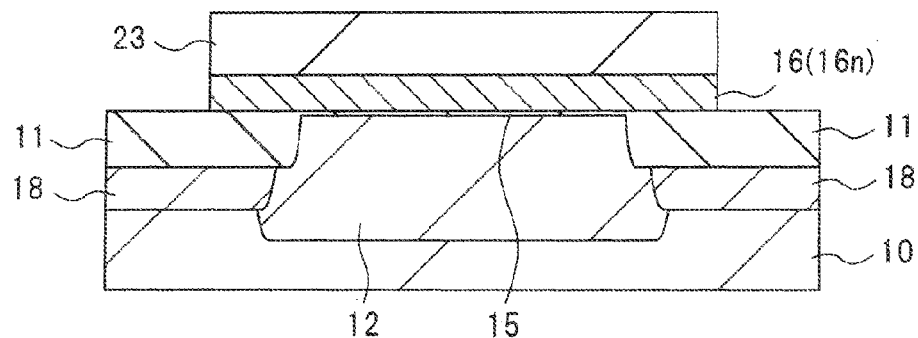
FIGS. 11B and 11C are major-part sectional diagrams of the semiconductor device along lines A-A and B-B, respectively, in FIG. 11A.
Figure 11C:
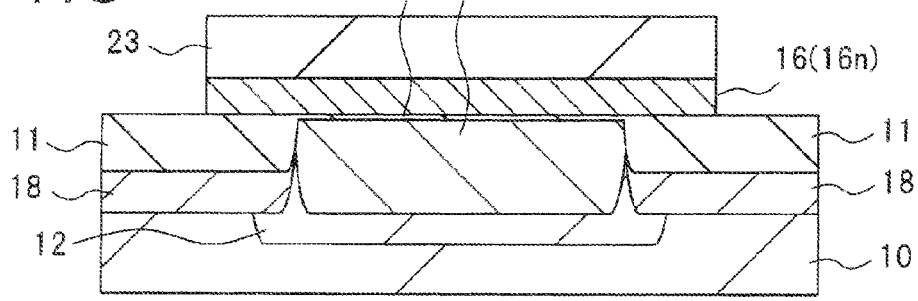

Subsequently, as illustrated in FIGS. 11A to 11C, the gate electrode 16 is formed over the gate oxide film 15 by dry-etching the polycrystalline silicon film 16n with a photoresist film 23 as a mask. The gate electrode 16 is formed such that its two end portions in the gate width direction cover the element isolation trenches 11.

Figure 12A:
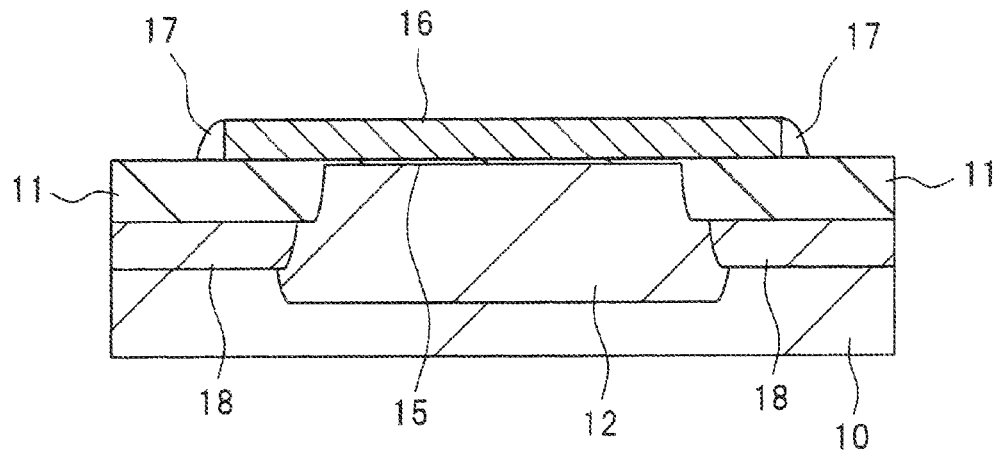
FIGS. 12A and 12B are each a major-part sectional diagram of the semiconductor device during the manufacturing process following FIGS. 11A to 11C.
Figure 12B:
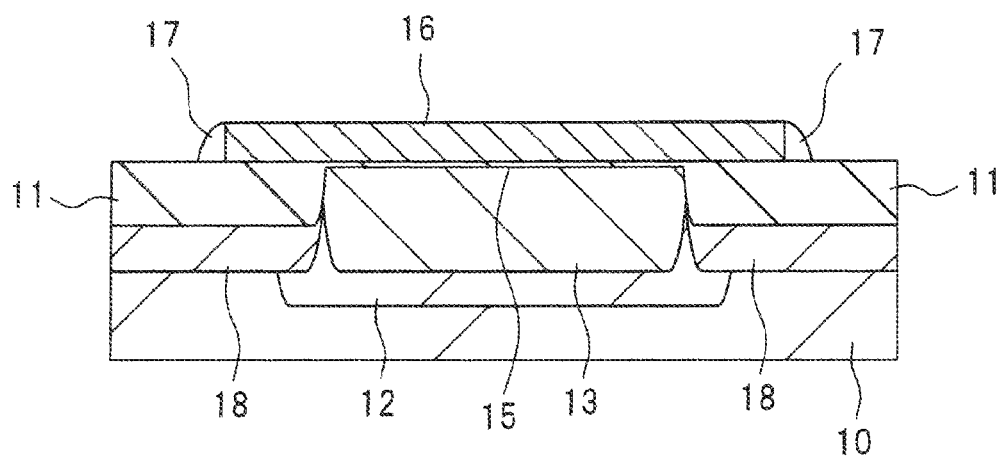

Subsequently, the photoresist film 23 is removed, and then as illustrated in FIGS. 12A and 12B, the sidewall spacer 17 is formed on each sidewall of the gate electrode 16. For example, the sidewall spacer 17 is formed by depositing a silicon oxide film by a CVD process over the main surface of the semiconductor substrate 10, and then performing anisotropic etching on the silicon oxide film.

Figure 13:
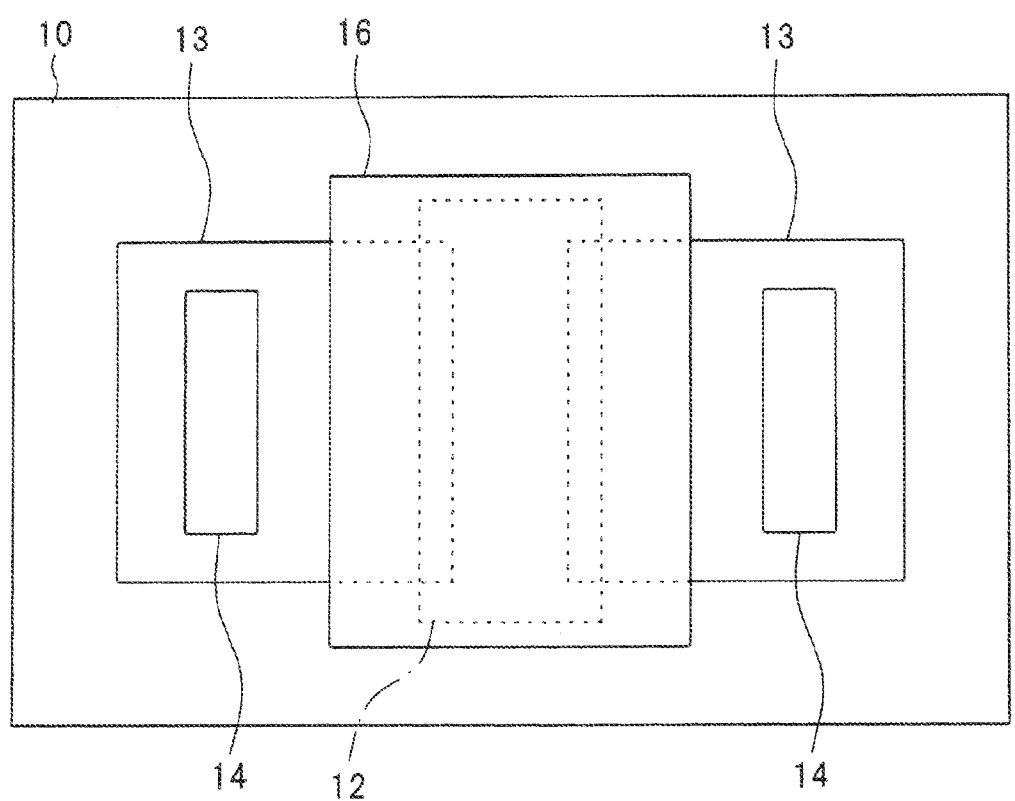
FIG. 13 is a major-part plan layout diagram of the semiconductor device during the manufacturing process following FIGS. 12A and 12B.

Subsequently, as illustrated in FIG. 13, an impurity (phosphorus or arsenic) is ion-implanted into part of the n-type low-concentration region 13 with an undepicted photoresist film as a mask, so that the n-type high-concentration region 14 is formed. Consequently, the source region and the drain region, each region having the LDD structure including the n-type low-concentration region 13 and the n-type high-concentration region 14, are formed across the gate electrode 16.

Figure 14A:
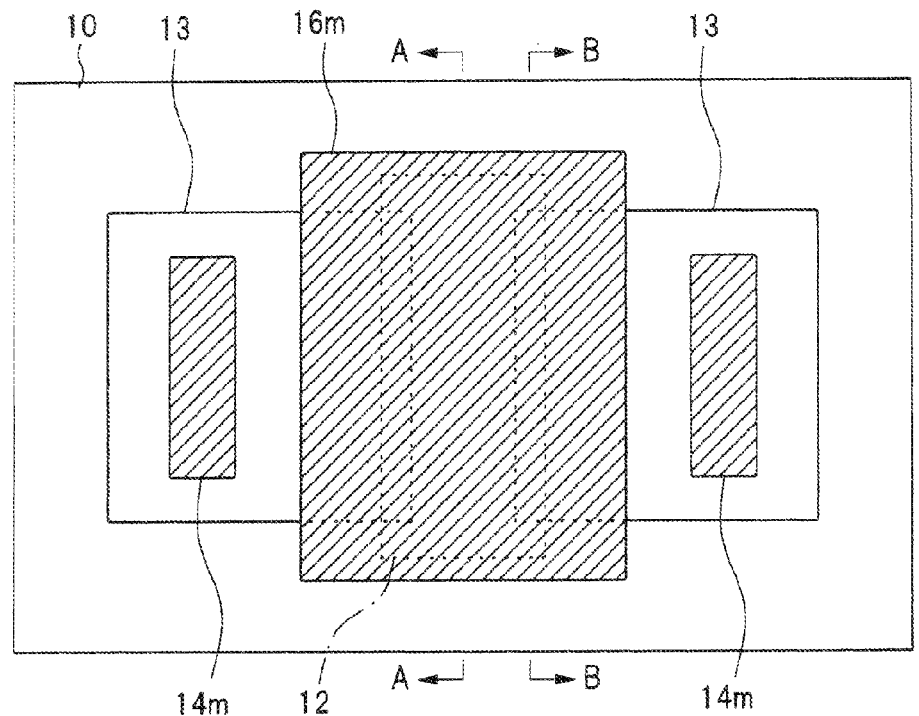
FIG. 14A is a major-part plan layout diagram of the semiconductor device during the manufacturing process following FIGS. 13.
Figure 14B:
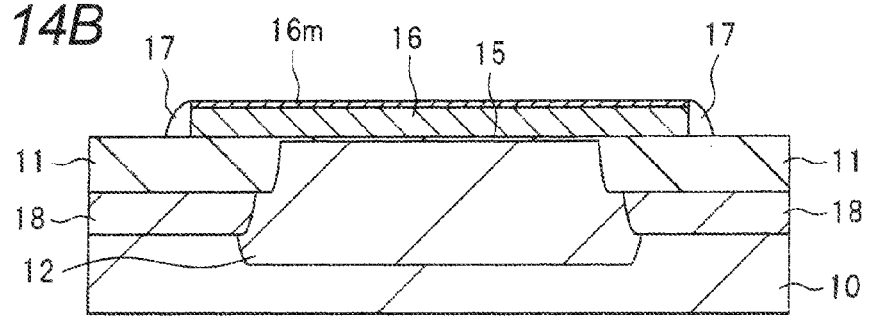
FIGS. 14B and 14C are major-part sectional diagrams of the semiconductor device along lines A-A and B-B, respectively, in FIG. 14A.
Figure 14C:
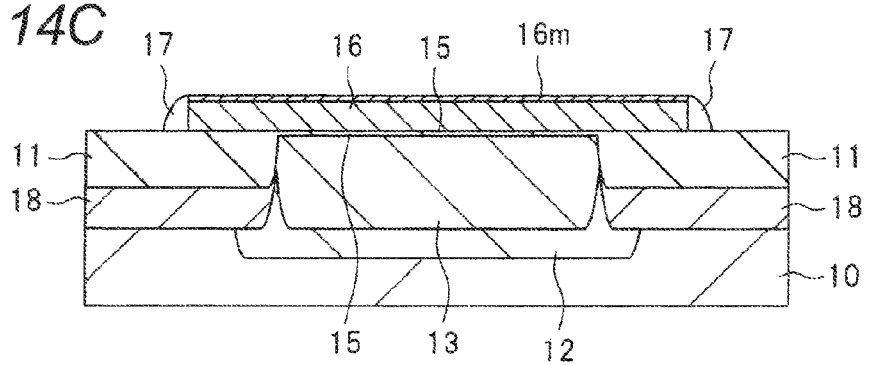
Figure 15A:
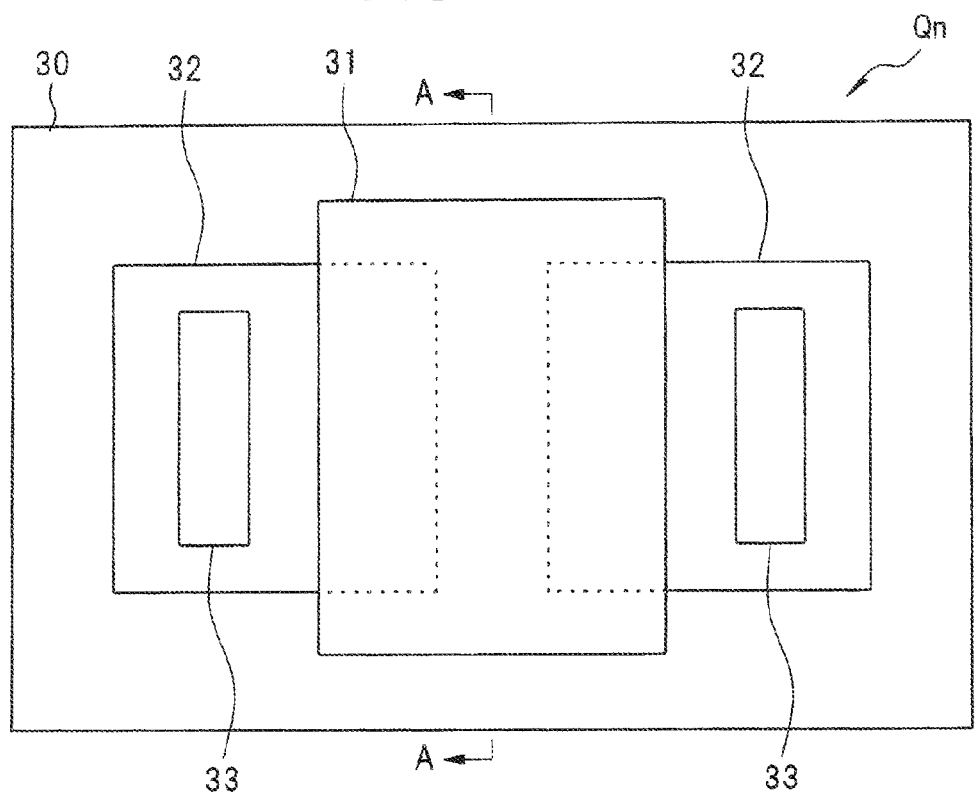
FIG. 15A is a major-part plan layout diagram of a MOSFET investigated by the inventors.
Figure 15B:
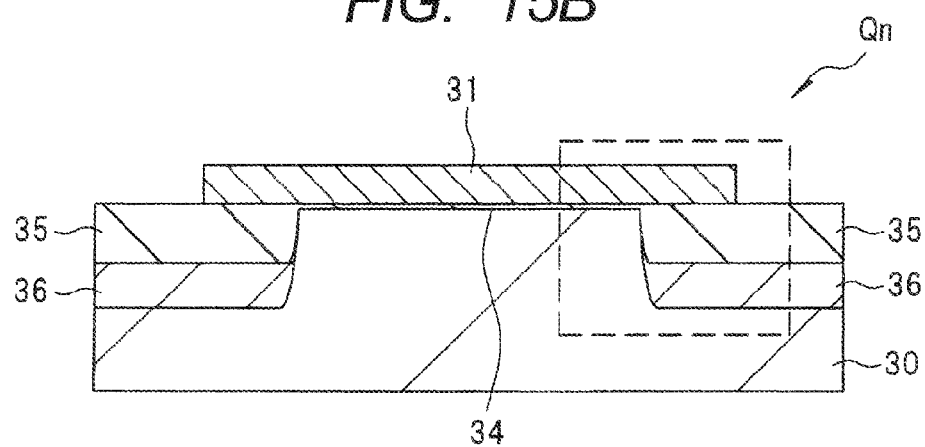
FIG. 15B is a major-part sectional diagram of the MOSFET along a line A-A in FIG. 15A.
Figure 16:
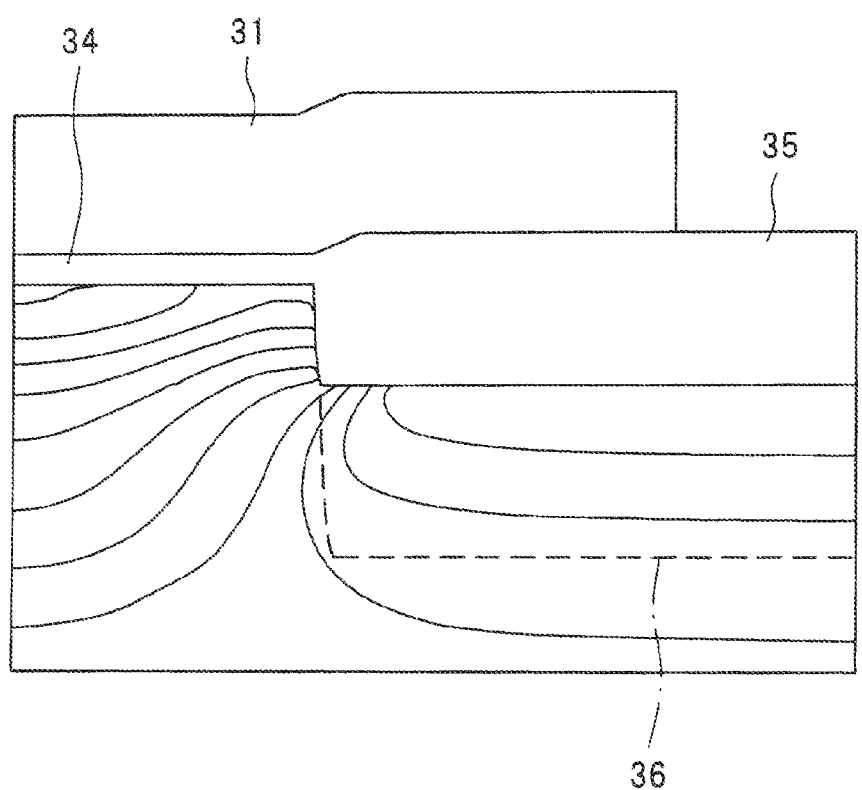
FIG. 16 is a graph illustrating a simulation result of an impurity profile in a region near an end of a channel region of the MOSFET illustrated in FIGS. 15A and 15B.

Subsequently, the photoresist film is removed, and then as illustrated in FIGS. 14A to 14C, the metal silicide layer 14m is formed in the surface portion of the n-type high-concentration region 14, and the metal silicide layer 16m is formed in the surface portion of the gate electrode 16. To form the metal silicide layers 14m and 16m, for example, a nickel film is deposited by a sputtering process over the main surface of the semiconductor substrate 10. Subsequently, the semiconductor substrate 10 is heat-treated, thereby the polycrystalline silicon film configuring the gate electrode 16 is reacted with the nickel film, and the single-crystal silicon layer configuring the n-type high-concentration region 14 is reacted with the nickel film, and then the unnecessary nickel film is removed by wet etching.

The MISFET (Qn) according to this embodiment illustrated in FIGS. 1 to 2C is completed through the above-described steps.

Although the invention achieved by the inventors has been described in detail according to an embodiment hereinbefore, the invention should not be limited thereto, and it will be appreciated that various modifications or alterations thereof may be made within the scope without departing from the gist of the invention.

Although the above-described embodiment shows a case where the invention is applied to the MISFET in which the n-type low-concentration region is provided in each of the source and drain regions, the invention may be applied to a MISFET in which the low-concentration region is provided in one of the source and drain regions.

Although the above-described embodiment shows an exemplary case where the invention is applied to the semiconductor device having the n-channel MISFET, the invention may also be applied to a semiconductor device in which a p-channel MISFET is provided in an n-type semiconductor substrate or an n-type well.

What is claimed is:

1. A method of manufacturing a semiconductor device, the method comprising the steps of:
    (a) providing a semiconductor substrate of a first conduction type;
    (b) forming a low-concentration source region and a low-concentration drain region of a second conduction type in a main surface portion of the semiconductor substrate by ion-implanting an impurity into the semiconductor substrate with a first photoresist film as a mask;
    (c) forming a channel stopper region of a first conduction type in the main surface portion of the semiconductor substrate by ion-implanting an impurity into the semiconductor substrate with a second photoresist film as a mask;
    (d) after the step (b) and the step (c), forming element isolation regions in the main surface portion of the semiconductor substrate;
    (e) forming a gate insulating film in a surface portion of an active region of the semiconductor substrate, the active region being partitioned by the element isolation regions;
    (f) forming a gate electrode over the gate insulating film; and
    (g) ion-implanting an impurity into a part of the low-concentration regions with a third photoresist film as a mask, thereby forming a high-concentration region of the second conduction type in the part of the low-concentration regions, the high-concentration region having an impurity concentration higher than the low-concentration regions,
    wherein the low-concentration source region faces the low-concentration drain region in a length direction of the gate electrode, and
    wherein, in a width direction of the gate electrode perpendicular to the length direction of the gate electrode, an end of the channel stopper region facing toward the center of the gate electrode in the width direction is offset from an end of the element isolation region facing toward the center of the gate electrode in the width direction.

2. The method according to claim 1, wherein an offset between the end of the element isolation region and the end of the channel stopper region is 0.5 to 0.7 μm.

* * * * *